US011070186B2

(12) United States Patent
Duchon et al.

(10) Patent No.: US 11,070,186 B2
(45) Date of Patent: Jul. 20, 2021

(54) ELECTRONIC FILTER INTENDED TO FILTER THE SUPPLY POWER OF AN ELECTRIC MOTOR

(71) Applicant: Valeo Systemes de Controle Moteur, Cergy Saint Christophe (FR)

(72) Inventors: Rudy Duchon, Cergy Saint Christophe (FR); Philippe Mercier, Cergy Saint Christophe (FR)

(73) Assignee: Valeo Systemes de Controle Moteur, Cergy Saint Christophe (FR)

( * ) Notice: Subject to any disclaimer, the term of this patent is extended or adjusted under 35 U.S.C. 154(b) by 0 days.

(21) Appl. No.: 15/581,829

(22) Filed: Apr. 28, 2017

(65) Prior Publication Data
US 2017/0317656 A1 Nov. 2, 2017

(30) Foreign Application Priority Data
Apr. 28, 2016 (FR) ...................................... 1653781

(51) Int. Cl.
*H03H 7/01* (2006.01)
*H02P 27/00* (2006.01)
(Continued)

(52) U.S. Cl.
CPC ......... *H03H 7/0115* (2013.01); *H02K 11/026* (2013.01); *H02K 11/33* (2016.01); *H02P 27/00* (2013.01); *F02B 39/10* (2013.01)

(58) Field of Classification Search
USPC ................................................... 318/400.24
See application file for complete search history.

(56) References Cited

U.S. PATENT DOCUMENTS

| 5,875,091 A * | 2/1999 | Rieken .............. H01R 13/6625 361/328 |
| 2003/0200761 A1* | 10/2003 | Funahashi .............. F01C 21/10 62/228.4 |

(Continued)

FOREIGN PATENT DOCUMENTS

| CN | 101573535 A | 11/2009 |
| CN | 204103753 U | 1/2015 |

(Continued)

OTHER PUBLICATIONS

Preliminary Search Report and Written Opinion issued in corresponding French Application No. FR1653781, dated Dec. 12, 2016 (8 pages).

(Continued)

Primary Examiner — Jorge L Carrasquillo
(74) Attorney, Agent, or Firm — Osha Bergman Watanabe & Burton LLP

(57) ABSTRACT

The invention relates to an electronic filter (100), intended to filter the supply power for electrical equipment, notably placed inside a motor vehicle, comprising:
a busbar (10) intended to exchange electrical energy between an electrical power supply source and an electric machine, the busbar (10) comprising:
at least one leadframe (12, 14) intended to transmit an electrical current between an electrical network and the electric machine,
the at least one leadframe (12, 14) being partly overmolded with electrically insulating material, and
an inductor (18) electrically connected to the at least one leadframe (12, 14),
characterized in that the electronic filter (100) comprises:
an electronic board (30) comprising at least one capacitor (32a-32h), the at least one capacitor (32a-32h) of the electronic board (30) being electrically connected to a
(Continued)

connection terminal (24, 26) of the at least one leadframe (14, 12) of the busbar (10).

14 Claims, 5 Drawing Sheets

(51) Int. Cl.
*F02B 39/10* (2006.01)
*H02K 11/026* (2016.01)
*H02K 11/33* (2016.01)

(56) References Cited

U.S. PATENT DOCUMENTS

| | | | |
|---|---|---|---|
| 2005/0167183 A1* | 8/2005 | Tominaga | H05K 7/1432 180/444 |
| 2007/0194875 A1* | 8/2007 | Wang | H05K 3/301 336/199 |
| 2007/0231165 A1* | 10/2007 | Koide | F04B 39/121 417/410.1 |
| 2010/0018243 A1* | 1/2010 | Tanaka | H02K 11/33 62/508 |
| 2011/0155414 A1* | 6/2011 | Yasukawa | B29C 45/14836 174/68.2 |
| 2011/0163705 A1* | 7/2011 | Sato | H02K 11/024 318/400.24 |
| 2011/0285226 A1* | 11/2011 | Fujita | H01L 24/49 310/71 |
| 2012/0160596 A1* | 6/2012 | Yamasaki | B62D 5/0406 180/443 |
| 2013/0009498 A1* | 1/2013 | Tisserand | H02K 11/026 310/72 |
| 2014/0300304 A1 | 10/2014 | Omae et al. | |
| 2015/0282324 A1* | 10/2015 | Miyawaki | H05K 1/181 361/775 |
| 2015/0349613 A1* | 12/2015 | Hattori | F04B 35/04 310/71 |
| 2016/0094153 A1* | 3/2016 | Li | H02M 7/797 363/123 |
| 2016/0226334 A1* | 8/2016 | Falguier | H05K 7/20909 |
| 2017/0149348 A1* | 5/2017 | Yanagimoto | H02M 7/003 |
| 2018/0049314 A1* | 2/2018 | Amaducci | G01R 31/31907 |

FOREIGN PATENT DOCUMENTS

| | | |
|---|---|---|
| CN | 104981972 A | 10/2015 |
| DE | 112013006708 T5 | 10/2015 |
| EP | 2133569 A1 | 12/2009 |
| EP | 2824807 A1 | 1/2015 |
| WO | 2011073562 A2 | 6/2011 |

OTHER PUBLICATIONS

First Office Action in corresponding Chinese Application No. 201710291018.5, dated May 8, 2020 (15 pages).

* cited by examiner

ELECTRONIC FILTER INTENDED TO FILTER THE SUPPLY POWER OF AN ELECTRIC MOTOR

A subject of the invention is an electronic filter intended to filter the supply power of an electric motor.

The invention relates also to a voltage converter comprising an electronic filter according to the invention, electrical equipment comprising a voltage converter according to the invention, and an electric supercharger comprising electrical equipment according to the invention and intended to compress the inlet gases in a combustion engine.

In general, an electric motor, notably for a motor vehicle, is supplied with power by power electronics modules. In particular, a power electronics module is supplied with electrical energy by a busbar.

Such a busbar comprises a set of electrical elements forming a filter, so as to filter the electrical energy intended to supply the power electronics modules. More specifically, the busbar comprises one or more inductors and capacitors fitted on the busbar.

The capacitors are, in general, fitted by crimping onto the busbar. However, the method for fitting the capacitors by crimping requires significant production costs and time. This is because the capacitors are fitted individually onto the busbar, thereby requiring a high amount of labour. Moreover, the crimping method introduces restrictions on the positioning of the capacitors on the busbar, notably due to the space needed for the tools for performing the crimping method.

The present invention aims to address these drawbacks by proposing an electronic filter in which electrical filtering components are decoupled between a busbar and an electronic board.

To this end, a subject of the invention is an electronic filter, intended to filter the supply power for electrical equipment, notably placed inside a motor vehicle, comprising:
  a busbar intended to exchange electrical energy between an electrical power supply source and an electric machine, the busbar comprising:
    at least one leadframe intended to transmit an electrical current between an electrical network and the electric machine,
    the at least one leadframe being partly overmoulded with electrically insulating material, and
    an inductor electrically connected to the at least one leadframe,
characterized in that the electronic filter comprises:
  an electronic board comprising at least one capacitor, the at least one capacitor of the electronic board being electrically connected to a connection terminal of the at least one leadframe of the busbar.

Advantageously, the production times and costs for an electronic filter according to the invention are reduced, notably by virtue of a reduction in the production times and costs of the busbar. Specifically, the arrangement of the capacitors of the electronic filter on the electronic board has the effect of reducing the dimensions of the busbar, notably by allowing the spaces on the busbar receiving the capacitors to be removed, as well as the space needed for the passage of the tools for electrically connecting the capacitors to the connection terminals of the leadframes.

Furthermore, the capacitors can be set up on the electronic board with automatic fabrication methods which do not require a significant amount of labour as the setting-up of capacitors on the busbar would.

The electronic filter according to the invention can also comprise one or more of the following characteristics, considered individually or according to all the possible combinations:
  the electronic board comprises a plurality of capacitors, each capacitor being electrically connected to a connection terminal of the at least one leadframe of the busbar; and/or
  the or each capacitor is surface-mounted on the electronic board; and/or
  the capacitors are fitted electrically in parallel with each other; and/or
  the inductor is fitted electrically in series with the or each capacitor; and/or
  the busbar and the electronic board are arranged face-to-face, such that the connection terminal of the at least one leadframe extends from the busbar towards the electronic board; and/or
  the connection terminal of the at least one leadframe extends transversely, notably substantially perpendicularly, from the busbar towards the electronic board; and/or
  the electronic board comprises a hole receiving the connection terminal, the connection terminal being in the form of a pin, the electronic board and the connection terminal being adapted such that the connection terminal is electrically connected to an electrical trace of the electronic board connected to the capacitor; and/or
  the connection terminal is soldered to the electrical trace by a selective wave method; and/or
  the electrically insulating material of the busbar is a plastic material; and/or
  the leadframe or power parts of the busbar are metal strips; and/or
  the leadframe or power parts of the busbar are metal bars; and/or
  the electronic board comprises a first and a second capacitor; the busbar comprises a first positive leadframe comprising a connection terminal electrically connected to the first capacitor, a first negative leadframe comprising a connection terminal electrically connected to the first capacitor, a second positive leadframe comprising a connection terminal electrically connected to the second capacitor, and a second negative leadframe comprising a connection terminal electrically connected to the second capacitor; and the inductor is electrically connected to each of the said first and second leadframes; and/or
  the electronic board comprises a plurality of first capacitors and a plurality of second capacitors; the busbar comprises a first positive leadframe comprising a plurality of connection terminals electrically connected to the plurality of first capacitors respectively, a first negative leadframe comprising a plurality of connection terminals electrically connected to the plurality of first capacitors respectively, a second positive leadframe comprising a plurality of connection terminals electrically connected to the plurality of second capacitors respectively, and a second negative leadframe comprising a plurality of connection terminals electrically connected to the plurality of second capacitors respectively; and the inductor is electrically connected to each of the said first and second leadframes.

The invention relates also to a voltage converter intended to control electrical energy exchanged between an electric machine and an electrical power supply source, comprising an electronic filter according to the invention.

The voltage converter according to the invention can also comprise one or more of the following characteristics considered individually or in combination:

the voltage converter comprises electronic switches configured to receive a current exchanged with the electric machine and an electronic control board configured to control the states of the said electronic switches, the said electronic control board comprising the electronic board of the electronic filter; and/or a first part of the electronic board comprises the said capacitor of the electronic filter and a second part of the electronic board, different from the first part, comprises components intended to control the states of the said electronic switches.

Another subject of the invention is electrical equipment comprising an electric machine and a voltage converter according to the invention, in which the voltage converter is fitted to the electric machine.

The invention relates also to an electric supercharger, notably for a motor vehicle, comprising electrical equipment according to the invention.

Other features and advantages of the present invention will become clear upon reading the description and from the following figures.

It is to be noted that these drawings do not serve any purpose other than to illustrate the text of the description and do not in any way constitute a limitation of the scope of the invention.

In the various figures, equivalent elements are denoted by identical references.

A subject of the invention is an electronic filter, intended to filter the supply power for electrical equipment, notably placed inside a motor vehicle.

Such an electronic filter comprises a busbar intended to exchange electrical energy between an electrical power supply source and an electric machine.

Figure 1:
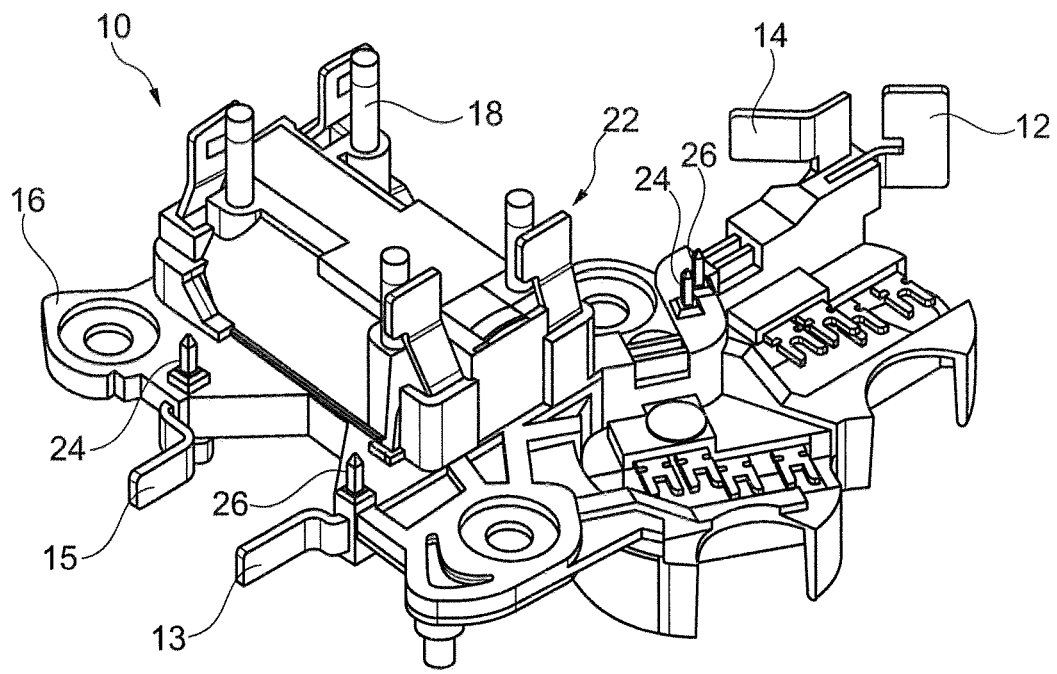
FIGS. 1 and 2 are two views of a busbar according to the invention.
Figure 2:
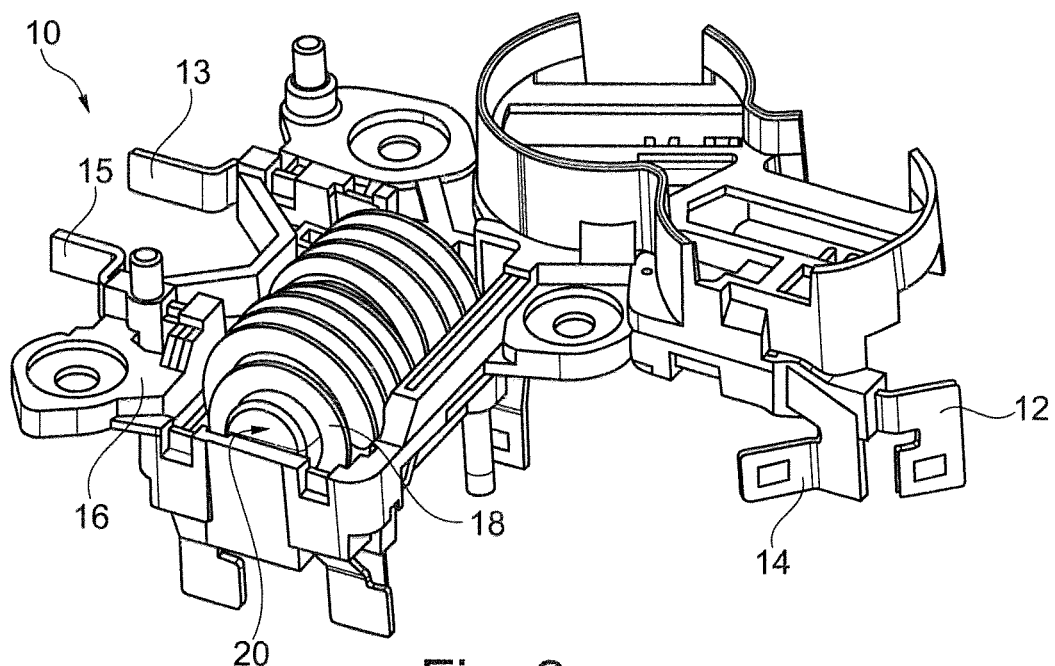

Such a busbar 10 is represented in FIGS. 1 and 2. The busbar 10 comprises at least one leadframe.

A leadframe is an electrically conducting power part, notably made of metal, for example copper. A leadframe can be a metal strip, or a metal bar.

A leadframe is intended to transmit an electrical current between an electrical network and the electric machine.

The electrical network is, for example, an electrical network of the motor vehicle, notably an electrical network supplied by an electrical voltage of +48 V. Preferably, the electrical network is a DC electrical power network.

For example, in FIG. 1, the busbar 10 comprises a positive leadframe 12 and a negative leadframe 14.

The positive leadframe 12 is notably intended to be electrically connected to a pole of positive polarity of an electrical network of a vehicle, for example to an electrical voltage of +48 V. The negative leadframe 14 is notably intended to be electrically connected to a pole of negative polarity of the electrical network, for example to an electrical voltage of 0 V.

The positive and negative leadframes 12, 14 are separate from one another and are partly overmoulded with electrically insulating material, for example plastic material.

Figure 3:
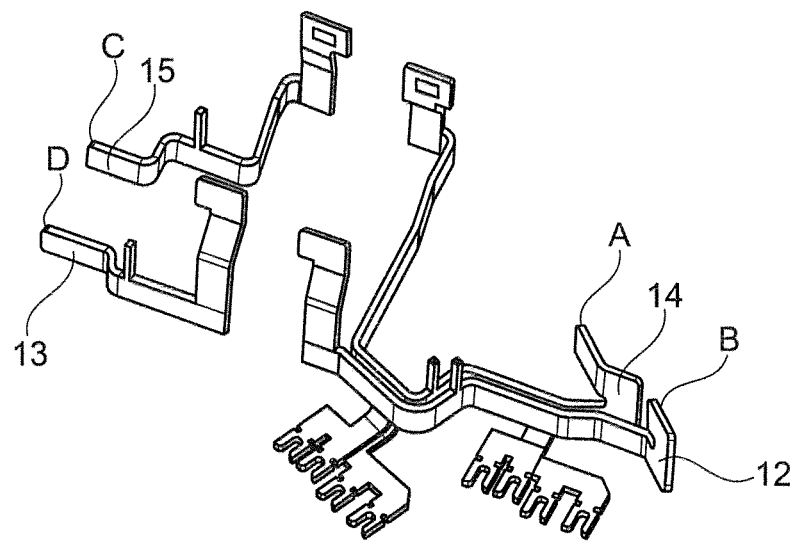
FIG. 3 represents the leadframes without overmoulding of the busbar of FIGS. 1 and 2.

For example, the overmoulding 16 of the positive and negative leadframes 12, 14 is visible in FIGS. 1 and 2, and the positive and negative leadframes 12, 14 represented without overmoulding are visible in FIG. 3.

The busbar 10 also comprises an inductor 18 electrically connected to the positive and negative leadframes 12, 14.

"Inductor" is understood to mean any electronic component intended by its construction to have a predetermined inductance value. For example, an inductor can refer to a coil, or a solenoid.

The busbar 10 can also comprise two leadframes 13, 15 intended to be electrically connected to the leadframes 12, 14. More specifically, the leadframes 13, 15 are intended to be electrically connected to the inductor 18, the inductor 18 being intended to be electrically connected to the leadframes 12, 14.

The leadframes 12, 13, 14, 15 comprise terminals B, D, A, C, respectively, represented in FIG. 3 and intended to be connected to electrical elements external to the busbar 10.

The busbar 10, and notably the overmoulding 16 of the positive and negative leadframes 12, 14, can comprise a receiving area 20, notably visible in FIG. 2, adapted to receive the inductor 18.

The inductor can be interference-fitted into the receiving area 20. In other words, the receiving area 20 can be adapted to receive the electrical component without play. Advantageously, by interference-fitting the inductor into the receiving area, good mechanical behaviour of the inductor in the receiving area can be ensured.

The inductor can be fitted bare, i.e. without a housing, in order to reduce the size of the said inductor, and consequently in order to reduce the dimensions of the receiving area, and therefore the dimensions of the busbar.

The busbar 10, and notably the overmoulding 16 of the positive and negative leadframes 12, 14, can comprise a connecting area 22, notably visible in FIG. 1, in which the positive and negative leadframes 12, 14 are intended to be electrically connected to the inductor 18.

The receiving area 20 and the connecting area 22 are advantageously separated by the overmoulding 16, so as to provide protection for the inductor when it is being electrically connected to the leadframes. Specifically, the overmoulding has the effect of preventing a spattering of metal, generated when the inductor is being electrically connected, notably by soldering, to the leadframes, notably when the inductor is fitted bare into the receiving area.

As represented in FIG. 2, the receiving area 20 can comprise a wall forming the base of the said receiving area 20, and a side wall extending from the said base in a direction that is substantially perpendicular to the said base. The side wall can extend continuously around the receiving area 20. Preferably, the side wall has a height of between 50% and 75% of the height of the inductor. Such a wall advantageously provides for protecting and mechanically holding the inductor, while ensuring thermal dissipation of the heat generated by the inductor.

Each positive and negative leadframe 12, 14 comprises at least one connection terminal 26, 24, notably represented in FIG. 1 and intended to be electrically connected to one or more electrical components external to the busbar 10. The electrical components can be, for example, filtering components such as capacitors.

The electronic filter 100 also comprises an electronic board 30. Such an electronic filter is notably represented in FIGS. 4 and 5.

The electronic board 30 comprises at least one capacitor 32a-32h. The capacitor 32a-32h of the electronic board 30 is electrically connected to a connection terminal 26 of the positive leadframe 12 and to a connection terminal 24 of the negative leadframe 14 of the busbar 10.

Figure 4:
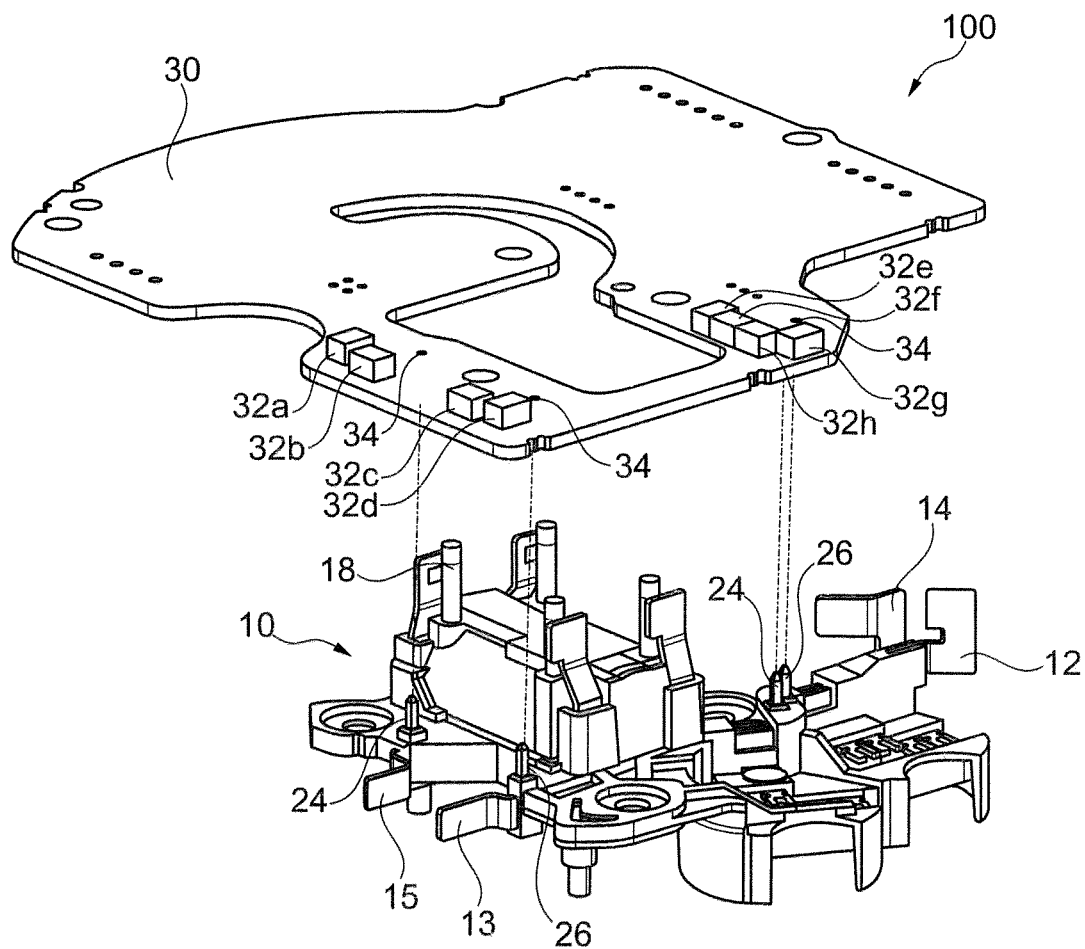
FIG. 4 represents an exploded view of an electronic filter according to the invention.
Figure 5:
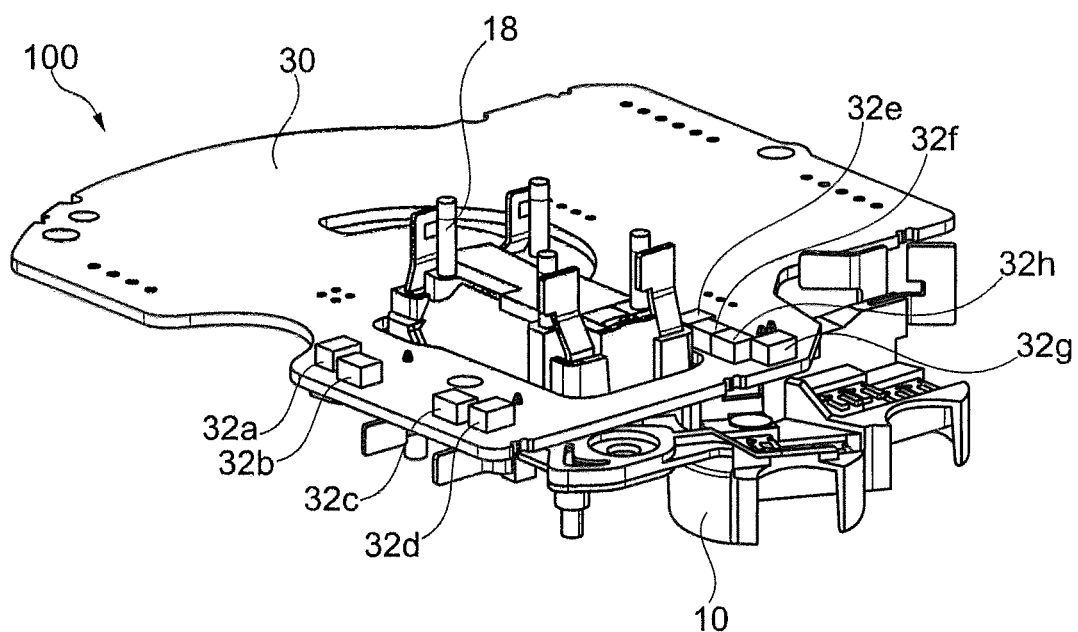
FIG. 5 represents an electronic filter according to the invention.

The electronic board 30 can comprise a plurality of capacitors 32a-32h, for example eight capacitors in FIGS. 4 and 5. Each capacitor 32a-32h of the electronic board 30 is electrically connected to a connection terminal 26 of the positive leadframe 12 and to a connection terminal 24 of the negative leadframe 14 of the busbar 10, the connection terminals of the leadframes being able to be the same or different for each capacitor.

In particular, the electronic board 30 can comprise a first capacitor 32a-32d and a second capacitor 32e-32h. A first capacitor is, for example, a capacitor located upstream of the inductor 18 described previously, and a second capacitor is, for example, a capacitor located downstream of the inductor 18 described previously. The upstream-downstream direction corresponds to a direction from the electrical network to the load to which the electronic filter is connected.

The electronic board 30 can also comprise a plurality of first capacitors 32a-32d and second capacitors 32e-32h.

The positive and negative leadframes 12, 14 can comprise one or more connection terminals 26, 24, respectively, electrically connected to the first or to each first capacitor 32a-32d and to the inductor 18. Likewise, the positive and negative leadframes 12, 14 can also comprise one or more connection terminals 26, 24, respectively, electrically connected to the second or to each second capacitor 32e-32h and to the inductor 18.

The or each capacitor 32a-32h can be surface-mounted on the electronic board 30. In other words, the electronic board according to the invention can be fabricated on standard production lines, using the surface-mount device (SMD) deposition method, thereby reducing the production costs of the electronic filter.

Advantageously, the arrangement of the capacitors of the electronic filter on the electronic board allows the spaces on the busbar receiving the capacitors to be removed, as well as the space needed for the passage of the tools for electrically connecting the capacitors to the connection terminals of the leadframes.

Figure 6:
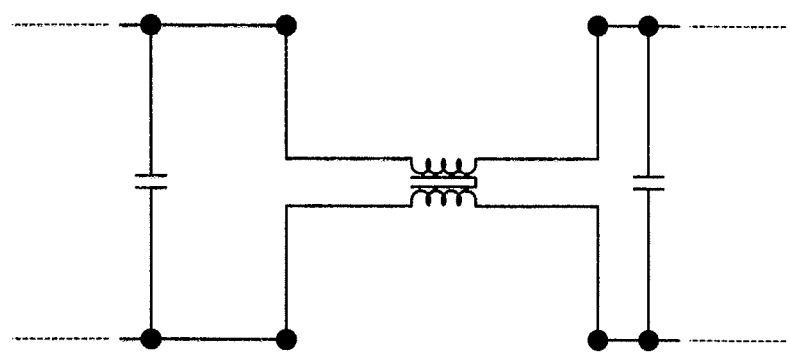
FIG. 6 represents an electrical circuit diagram of an electronic filter according to the invention.

FIG. 6 represents an electrical circuit diagram of an electronic filter according to the invention.

The capacitors 32a-32d, 32e-32h can be fitted electrically in parallel with each other.

The inductor 18 can be fitted electrically in series with the capacitors 32a-32d, 32e-32h. For example, in FIG. 4, the inductor 18 is intended to be fitted electrically in series with the group of capacitors 32a-32d, and with the group of capacitors 32e-32h, each group of capacitors comprising four capacitors. In particular, the capacitors 32a-32d can be fitted electrically in parallel with each other and the set of these capacitors is fitted in series with the inductor 18. Similarly, the capacitors 32e-32h can be fitted electrically in parallel with each other and the set of these capacitors is fitted in series with the inductor 18.

As represented in FIG. 4, the busbar 10 and the electronic board 30 are arranged face-to-face.

In particular, the connection terminals 26, 24 of the positive and negative leadframes 12, 14 extend, notably transversely, for example substantially perpendicularly, from the busbar 10 towards the electronic board 30.

The electronic board can comprise holes 34 receiving the connection terminals 24, 26. In particular, the connection terminals 24, 26 can be in the form of pins.

The electronic board can comprise one or more electrical traces connected to the capacitors 32a-32h.

The electronic board 30 and the connection terminals 24, 26 can be adapted such that the connection terminals 24, 26 can be electrically connected to the or each electrical trace of the electronic board 30.

The connection terminals 24, 26 can be soldered to the or each electrical trace by a selective wave method, or by any other means, such as for example total wave soldering, electrical soldering, and soldering-iron or laser soldering.

The invention relates also to an electric supercharger, notably for a motor vehicle, comprising electrical equipment.

The electrical equipment comprises an electric machine and a voltage converter. In particular, the voltage converter is fitted on the electric machine.

The voltage converter is intended to control electrical energy exchanged between the electric machine and an electrical power supply source.

The voltage converter comprises an electronic filter as described previously.

Figure 7:
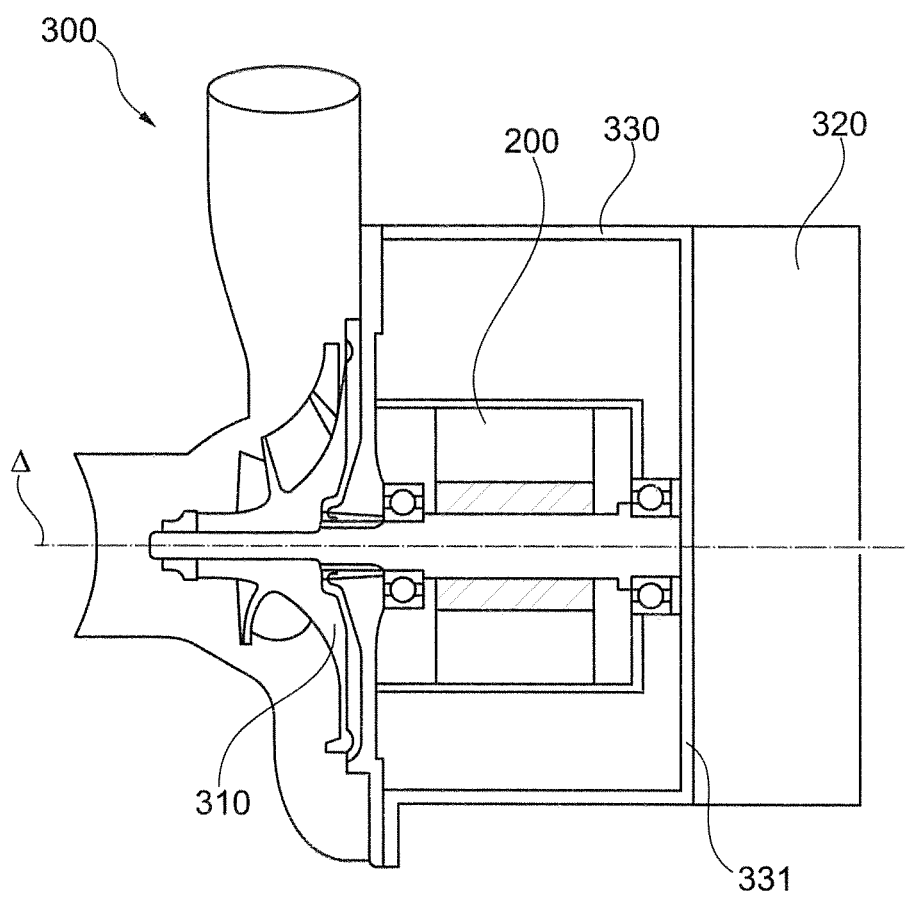
FIGS. 7 and 8 represent views partly in cross-section and in cross-section, respectively, of an electric supercharger according to the invention.
Figure 8:
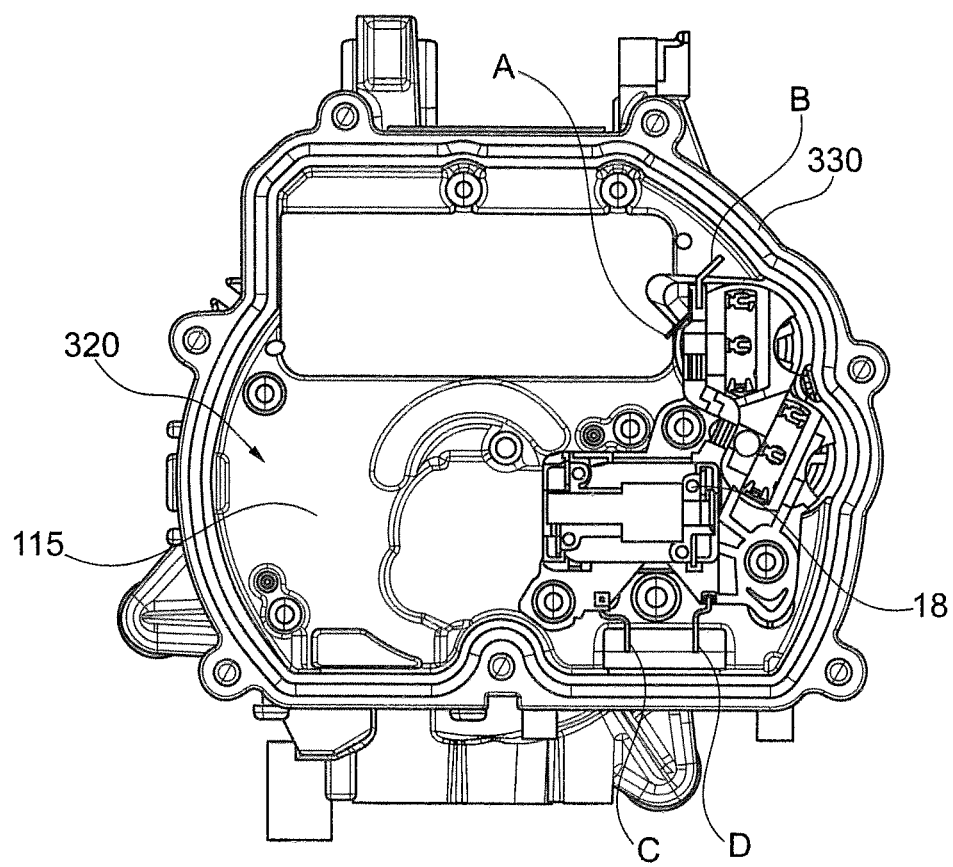

FIGS. 7 and 8 illustrate an example electric supercharger 300 comprising the voltage converter 320 and the electric machine 200, notably a rotating electric machine. Notably, the electric supercharger 300 is configured to be placed inside a vehicle to compress the inlet gases of the combustion engine of the vehicle. In particular, the electrical network is an electrical network of the vehicle and comprises a battery supplying the said electrical network. The supercharger 300 comprises a compressor wheel 310 intended to compress the inlet air of a combustion engine and in combination with which the electric supercharger 300 is fitted. The compressor wheel 310 is rotationally driven by the electric machine 200. Notably, the supercharger 300 can comprise a housing 330 which includes the compressor wheel 310, the electric machine 200 and the voltage converter 320. This housing 330 can be in several parts which are fitted one to the other to form the housing 330.

In the voltage converter 320, the electronic filter can be fitted on a surface 115. This surface 115 is notably perpendicular to the axis of rotation Δ of the electric machine 200. In particular, the support surface 115 can be a face of a wall which separates two chambers of the housing 330. For example, the support surface 115 can be a face of a wall 331 separating a chamber of the housing 330 comprising the voltage converter 320 from another chamber comprising the electric machine 200. The electronic filter is notably electrically connected to electronic components (not represented) which control the energy exchanged with the electric machine 200, in order to supply these electronic components. The electronic filter can be connected to these electronic components via terminals A, B, notably represented in FIGS. 3 and 8, located downstream of the inductor 18 described previously. The electronic filter is notably connected to the electrical network by terminals C, D, notably represented in FIGS. 3 and 8, located upstream of the inductor 18 described previously.

In the example illustrated in FIGS. 7 and 8, the electric machine 200 is located notably between the voltage converter 320 and the compressor wheel 310. The voltage converter 320 is thus placed at an axial end of the electric supercharger 300. A cover can be introduced to close off the voltage converter 320 while being supported on the housing 330. The electric machine 200 can be positioned along the axis of rotation Δ between the voltage converter 320 and the compressor wheel 310, i.e. between an axial area corresponding to the voltage converter 320 and an axial area corresponding to the compressor wheel 310. However, the arrangement of the compressor wheel 310, of the electric machine 200 and of the voltage converter 320 can be different. For example, the voltage converter 320 can be placed between the electric machine 200 and the compressor wheel 310.

The voltage converter can also comprise electronic switches.

The electronic switches are configured to receive a current exchanged with the electric machine and an electronic control board. The electronic control board is configured to control the states of the said electronic switches.

Preferably, the electronic control board comprises the electronic board of the electronic filter.

In particular, the electronic board can comprise a first part and a second part, the second part being different from the first part. The first part of the electronic board can comprise the or each capacitor of the electronic filter and the second part of the electronic board comprises electrical components intended to control the states of the said electronic switches.

The invention claimed is:

1. An electronic filter for filtering the supply power for electrical equipment, the electronic filter being placed inside a motor vehicle, comprising:
    a busbar for exchanging electrical energy between an electrical power supply source and an electric machine, the busbar comprising:
        at least one leadframe configured to transmit an electrical current between an electrical network and the electric machine, the at least one leadframe being partly overmoulded with electrically insulating material,
        a connection terminal electrically connected to the at least one leadframe,
        a connecting area for electrically connecting an inductor to the at least one leadframe,
        the inductor comprising a coil for providing an inductance value and a plurality of pins for connecting to the connecting area, and
        a receiving area bounded by a base wall and a circumferential wall protruding from the base wall that are formed by the electrically insulating material, wherein the receiving area receives the coil through an open end of the receiving area such that the plurality of pins penetrates the base wall to contact the connecting area disposed on an opposite side of the base wall; and
    an electronic board comprising an electrical trace connected to at least one capacitor, the at least one capacitor being electrically connected using the electrical trace to the connection terminal of the at least one leadframe of the busbar.

2. The electronic filter according to claim 1, in which the at least one capacitor is surface-mounted on the electronic board.

3. The electronic filter according to claim 2, in which the connection terminal of the at least one leadframe extends transversely and substantially perpendicularly from the busbar towards the electronic board.

4. The electronic filter according to claim 1, in which the busbar and the electronic board are arranged face-to-face, such that the connection terminal of the at least one leadframe extends from the busbar towards the electronic board.

5. The electronic filter according to claim 4, in which the electronic board comprises a hole receiving the connection terminal, the connection terminal being in the form of a pin.

6. The electronic filter according to claim 1, in which the electronic board comprises a first and a second capacitor, and the busbar comprises:
    a first positive leadframe comprising a connection terminal electrically connected to the first capacitor,
    a first negative leadframe comprising a connection terminal electrically connected to the first capacitor,
    a second positive leadframe comprising a connection terminal electrically connected to the second capacitor, and
    a second negative leadframe comprising a connection terminal electrically connected to the second capacitor,
    in which the inductor is electrically connected to each of the said first and second leadframes.

7. A voltage converter for controlling electrical energy exchanged between an electric machine and an electrical power supply source, comprising the electronic filter according to claim 1.

8. The voltage converter according to claim 7, further comprising electronic switches configured to receive a current exchanged with the electric machine and an electronic control board configured to control the states of the said electronic switches, the electronic control board comprising the electronic board of the electronic filter.

9. The voltage converter according to claim 8, in which a first part of the electronic board comprises the said capacitor of the electronic filter and a second part of the electronic board, different from the first part, comprises components intended to control the states of the said electronic switches.

10. An electrical equipment comprising:
    an electric machine; and
    a voltage converter according to claim 7, in which the voltage converter is fitted to the electric machine.

11. An electric supercharger for a motor vehicle, comprising electrical equipment according to claim 10.

12. The electronic filter according to claim 1,
    wherein the receiving area mechanically receives the inductor based on interference-fitting,
    wherein the connecting area and the receiving area are separated by the base wall.

13. The electronic filter according to claim 12, in which the a base wall and the circumferential wall protect the inductor from a spattering of metal, generated when the inductor is being electrically connected to the leadframe.

14. An electronic filter for filtering the supply power for electrical equipment, the electronic filter being placed inside a motor vehicle, comprising:
    a busbar for exchanging electrical energy between an electrical power supply source and an electric machine, the busbar comprising:
        at least one leadframe configured to transmit an electrical current between an electrical network and the electric machine, the at least one leadframe being partly overmoulded with electrically insulating material,
        a connection terminal electrically connected to the at least one leadframe,
        a connecting area for electrically connecting an inductor to the at least one leadframe;

the inductor comprising a coil for providing an inductance value and a plurality of pins for connecting to the connecting area, and a receiving area bounded by a base wall and a circumferential wall protruding from the base wall that are formed by the electrically insulating material, wherein the receiving area receives the coil through an open end of the receiving area such that the plurality of pins penetrates the base wall to contact the connecting area disposed on an opposite side of the base wall; and an electronic board comprising an electrical trace connected to at least one capacitor, the at least one capacitor being electrically connected using the electrical trace to the connection terminal of the at least one leadframe of the busbar, wherein the connection terminal is soldered to the electrical trace of the electronic board to assemble the busbar and the electronic board together.

* * * * *